(12) United States Patent
Gonzales et al.

(10) Patent No.: US 10,530,325 B1
(45) Date of Patent: Jan. 7, 2020

(54) LOW LOSS T-COIL CONFIGURATION WITH FREQUENCY BOOST FOR AN ANALOG RECEIVER FRONT END

(71) Applicants: Advanced Micro Devices, Inc., Santa Clara, CA (US); ATI Technologies ULC, Markham (CA)

(72) Inventors: Dean E. Gonzales, Fort Collins, CO (US); Xuan Chen, Richmond Hill (CA); Jeffrey Cooper, Fort Collins, CO (US); Milam Paraschou, Dellwood, MN (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 0 days.

(21) Appl. No.: 16/118,054

(22) Filed: Aug. 30, 2018

(51) Int. Cl.
| | | |
|---|---|---|
| H04B 3/00 | (2006.01) | |
| H03H 7/38 | (2006.01) | |
| H03M 9/00 | (2006.01) | |
| H04L 25/02 | (2006.01) | |
| H02H 9/04 | (2006.01) | |

(52) U.S. Cl.
CPC .............. *H03H 7/38* (2013.01); *H02H 9/045* (2013.01); *H03M 9/00* (2013.01); *H04L 25/0278* (2013.01); *H04L 25/0292* (2013.01)

(58) Field of Classification Search
CPC ........... H03H 7/38; H02H 9/045; H03M 9/00; H04L 25/0278; H04L 25/0292
See application file for complete search history.

(56) References Cited

U.S. PATENT DOCUMENTS

| | | | | | |
|---|---|---|---|---|---|
| 3,795,901 A | * | 3/1974 | Boehm | ............... | G06F 11/1625 |
| | | | | | 710/305 |
| 4,689,620 A | * | 8/1987 | Wondrak | ................ | E21B 47/12 |
| | | | | | 340/854.9 |
| 5,694,427 A | * | 12/1997 | Wincn | .................... | H04L 12/44 |
| | | | | | 330/255 |
| 5,963,484 A | * | 10/1999 | Jung | ...................... | G11C 7/067 |
| | | | | | 365/189.09 |
| 6,504,420 B1 | * | 1/2003 | Vorenkamp | ......... | H01F 17/0006 |
| | | | | | 257/E27.046 |

(Continued)

OTHER PUBLICATIONS

Paraschou et al., U.S. Appl. No. 16/140,356, entitled "Low Power Mechanism for VTT Generation for Receiver Termination", filed Sep. 24, 2018, 38 pages.

(Continued)

*Primary Examiner* — Tesfaldet Bocure
(74) *Attorney, Agent, or Firm* — Rory D. Rankin; Kowert, Hood, Munyon, Rankin & Goetzel, P.C

(57) ABSTRACT

Systems, apparatuses, and methods for performing efficient data transfer in a computing system are disclosed. A computing system includes multiple transmitters sending singled-ended data signals to multiple receivers. A receiver includes multiple series inductors moved from a signal path to sampling circuitry to a termination path used for impedance matching. The removed direct current (DC) resistances of the inductors in the signal path reduces signal attenuation. The termination path has alternating current (AC) reactances of the inductors, which provide a frequency-dependent termination impedance. This termination impedance provides a positive reflection coefficient for high operating frequencies, which boosts the input signal being received by the sampling circuitry.

17 Claims, 4 Drawing Sheets

(56) References Cited

U.S. PATENT DOCUMENTS

| | | | |
|---|---|---|---|
| 6,720,804 B2 | 4/2004 | Taguchi et al. | |
| 6,937,111 B2 | 8/2005 | Kwon | |
| 6,944,071 B2 | 9/2005 | Martin | |
| 6,992,501 B2 | 1/2006 | Rapport | |
| 7,034,565 B2 | 4/2006 | Lee | |
| 7,095,217 B1 | 8/2006 | Niculae et al. | |
| 7,099,395 B1 | 8/2006 | Sidiropoulos et al. | |
| 8,164,362 B2* | 4/2012 | Afghahi | G11C 7/06 327/51 |
| 8,344,808 B2* | 1/2013 | Samavedam | H03F 1/086 330/255 |
| 8,710,810 B1* | 4/2014 | McJimsey | H02M 3/1584 323/272 |
| 2003/0234674 A1 | 12/2003 | Morgan | |
| 2004/0264230 A1 | 12/2004 | Brand et al. | |
| 2006/0117155 A1* | 6/2006 | Ware | G11C 7/1006 711/163 |
| 2008/0029824 A1 | 2/2008 | Baizley et al. | |
| 2010/0164622 A1 | 7/2010 | Ge et al. | |
| 2012/0197568 A1 | 8/2012 | Souma | |
| 2015/0002189 A1 | 1/2015 | Dietl et al. | |
| 2017/0169868 A1* | 6/2017 | Huang | G11C 7/14 |
| 2017/0288434 A1 | 10/2017 | Narita | |

OTHER PUBLICATIONS

Singh et al., U.S. Appl. No. 16/140,364, entitled "Pseudo Differential Receiving Mechanism for Single-Ended Signaling", filed Sep. 24, 2018, 24 pages.

Non-Final Office Action in U.S. Appl. No. 16/140,356, dated Jul. 12, 2019, 9 pages.

Non-Final Office Action in U.S. Appl. No. 16/140,364, dated Jul. 18, 2019, 6 pages.

Tyan, Eer-Wen, U.S. Appl. No. 11/147,002, entitled "Low power termination circuit", filed Jun. 7, 2005, 15 pages.

* cited by examiner

LOW LOSS T-COIL CONFIGURATION WITH FREQUENCY BOOST FOR AN ANALOG RECEIVER FRONT END

BACKGROUND

Description of the Related Art

When transferring information between functional blocks in a semiconductor chip, electrical signals are sent on multiple, parallel metal traces. Transmitters in a first functional block send the electrical signals across the parallel metal traces. Receivers in a second functional block receive the electrical signals. In some cases, the two functional blocks are within a same die. In other cases, the two functional blocks are on separate dies. In either case, the metal traces have transmission line effects such as distributed inductance, capacitance and resistance throughout its length. For modern integrated circuits, the interconnect capacitance reduces signal integrity and signal transfer rate more so than gate capacitance of semiconductor devices.

The interconnect capacitance per unit length includes both sidewall fringing capacitance and cross-coupling capacitance. For example, the electromagnetic fields for the metal traces conducting signals and the return current on the ground plane create electrical interference on neighboring metal traces and on adjacent devices. As the operating voltage continues to decrease to reduce power consumption, the signal swing used for Boolean logic decreases as well as the noise margin. Accordingly, signal attenuation occurs, which negatively affects the input signals received by sampling circuitry in the receivers.

In view of the above, efficient methods for receiving information as signals in a computing system are desired.

BRIEF DESCRIPTION OF THE DRAWINGS

The advantages of the methods and mechanisms described herein may be better understood by referring to the following description in conjunction with the accompanying drawings, in which.

Figure 1:
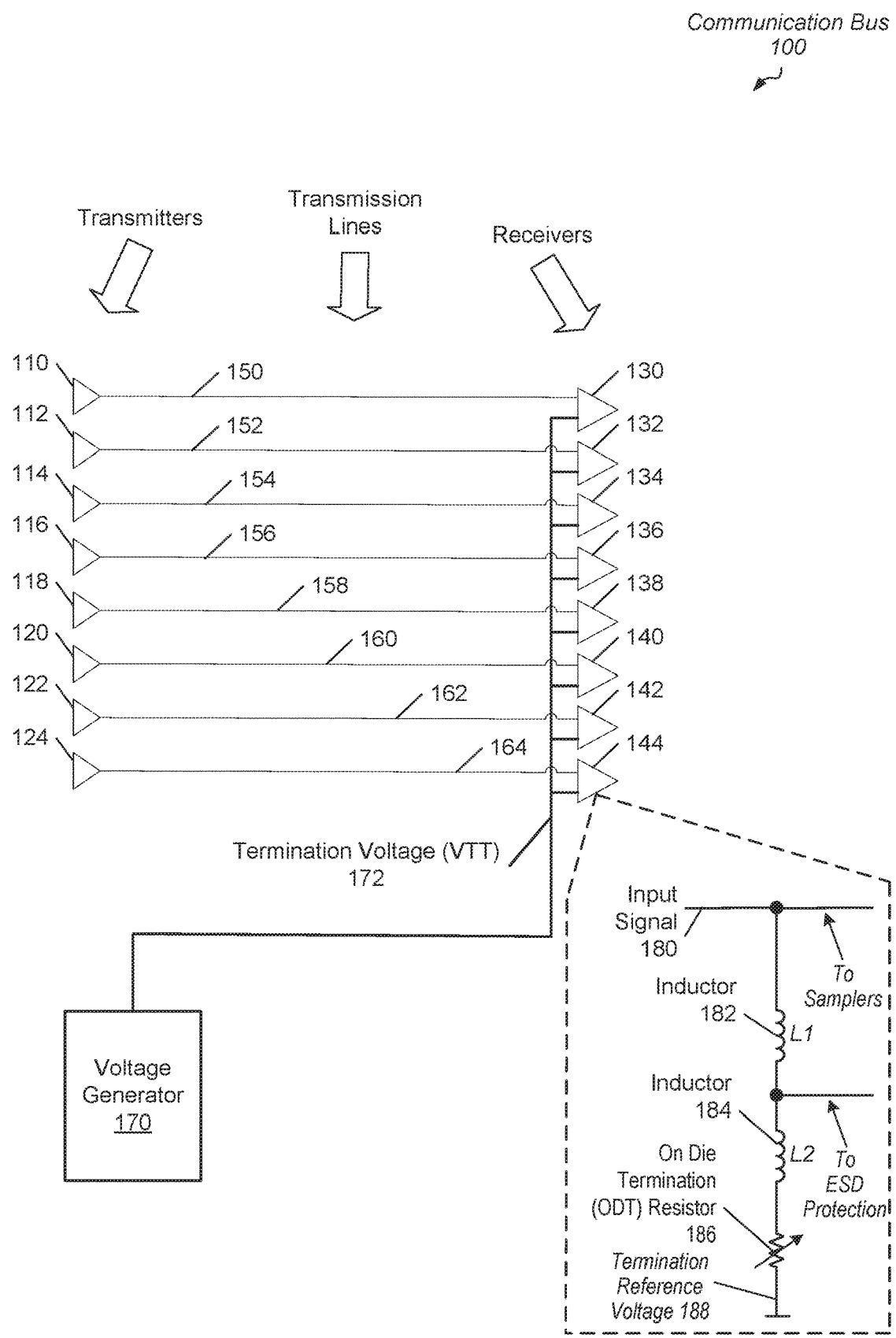
FIG. 1 is a block diagram of one embodiment of a communication bus.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for receiving information as signals in a computing system are disclosed. In various embodiments, a computing system includes one or more functional blocks for processing applications. Examples of the functional blocks include a general-purpose central processing unit (CPU), a graphics processing unit (GPU), an accelerated processing unit (APU), an input/output (I/O) device, a memory controller for system memory, and so forth. The computing system also includes multiple interfaces for transferring data between the functional blocks. In some cases, two functional blocks transferring data between one another are within a same die. In other cases, the two functional blocks are on separate dies.

When transferring information between functional blocks, electrical signals are sent on multiple, parallel metal traces. Transmitters in a first functional block send the electrical signals across the parallel metal traces. Receivers in a second functional block receive the electrical signals. In either case, the metal traces have transmission line effects, such as distributed inductance, capacitance and resistance throughout the line length. To reduce signal reflection, the far end (receiving end) of the metal traces are terminated using the characteristic impedances of the metal traces. In some embodiments, on-die termination (ODT) is used where a termination resistor for impedance matching is located inside the receiver instead of externally from the receiver such as on a printed circuit board (PCB) or off-die on a system on a chip (SOC) or multichip module (MCM).

In addition to terminating the metal trace at the receiver, each receiver includes circuitry for electrostatic discharge protection and sampling circuitry for reconstructing the received input signal. The sampling circuitry reconstructs the input signal by comparing the received input signal to a reference voltage received on a second terminal. In some embodiments, one or more generators send a termination voltage and the reference voltage to multiple receivers. In one or more of the multiple receivers, in various embodiments, the sampling circuitry receives the first signal on its first terminal without series inductors between the input signal and the first terminal of the sampling circuitry. Therefore, the sampling circuitry maintains a direct connection to an input pin of the receiver.

The direct connection between the input pin of the receiver and the first terminal of the sampling circuitry reduces signal attenuation. An inductor has a direct current (DC) resistive component. The resistive component performs a conversion of the electrical current to heat, or thermal energy, which causes loss of electrical information in the signal. A cost, which is the loss (signal attenuation), occurs by having the signal traverse a series inductor. The receiver moves the DC resistances of series inductors from a first path between the input pin and the sampling circuitry to a second path between the input pin and the termination circuitry used for impedance matching.

In addition to having the series inductors move to the termination path, shielding the first terminal of the sampling circuitry from particular parasitic capacitance is obtained by coupling the particular parasitic capacitance to an intermediate node of the multiple series inductors. For example, some varieties of electrostatic discharge (ESD) protection circuitry, such as human body model (HBM) protection circuitry, have appreciable parasitic capacitance. This parasitic capacitance attenuates the input signal when directly connected to the input signal. To shield this capacitance and still provide ESD protection, the ESD protection circuitry is connected to an intermediate node of the multiple series inductors used in the path to the termination circuitry.

Although the multiple series inductors provide additional DC resistance in the path to the termination circuitry, impedance matching is still maintained. For example, the value of the on-die termination (ODT) resistor is tuned based on the additional resistance of the multiple series inductors. In one example, if the impedance of the transmission line is 50 ohms and the total resistance of the multiple series inductors is 3 ohms, then the ODT resistor is set to 47 ohms. The series path from the input signal through the multiple series inductors to the ODT resistor has a resistance of the sum of the 3 ohms and the 47 ohms, which totals the 50 ohm impedance of the transmission line. Further, the multiple series inductors in this path provide higher termination impedance at higher signal operating frequencies, which boosts the input signal being received at the first terminal of the sampling circuitry.

Figure 2:
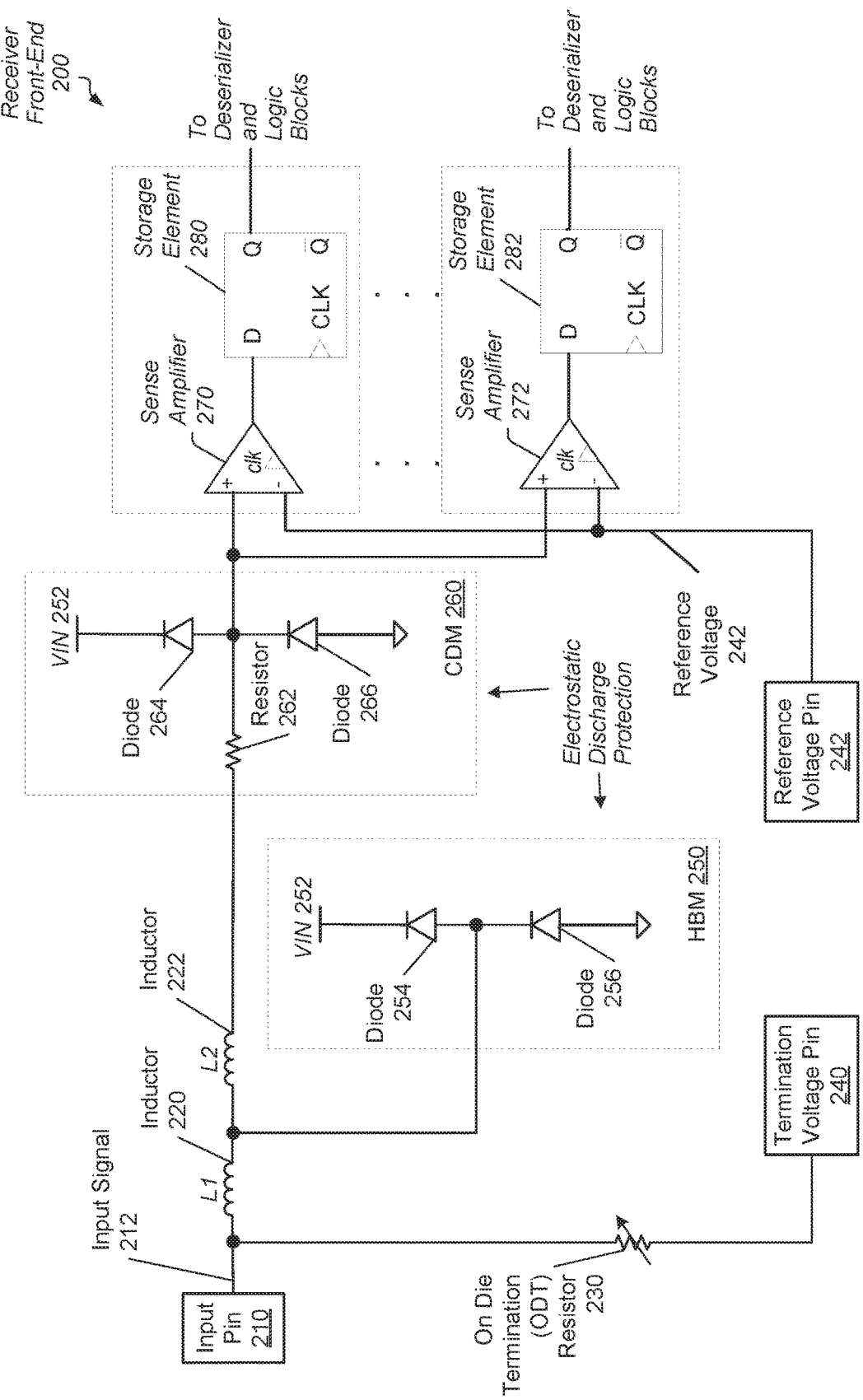
FIG. 2 is a block diagram of one embodiment of a receiver front-end.
Figure 3:
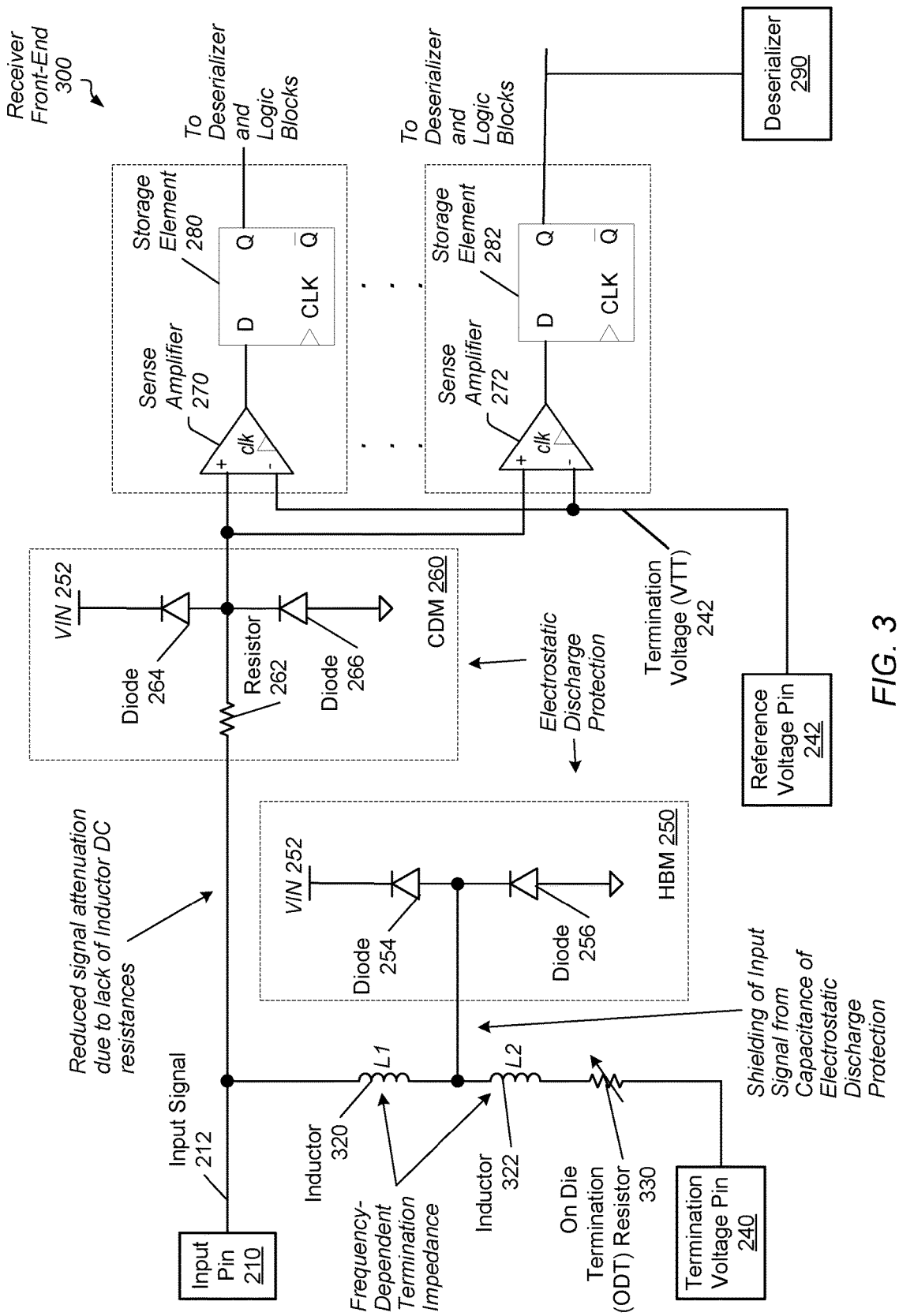
FIG. 3 is a block diagram of one embodiment of a receiver front-end.
Figure 4:
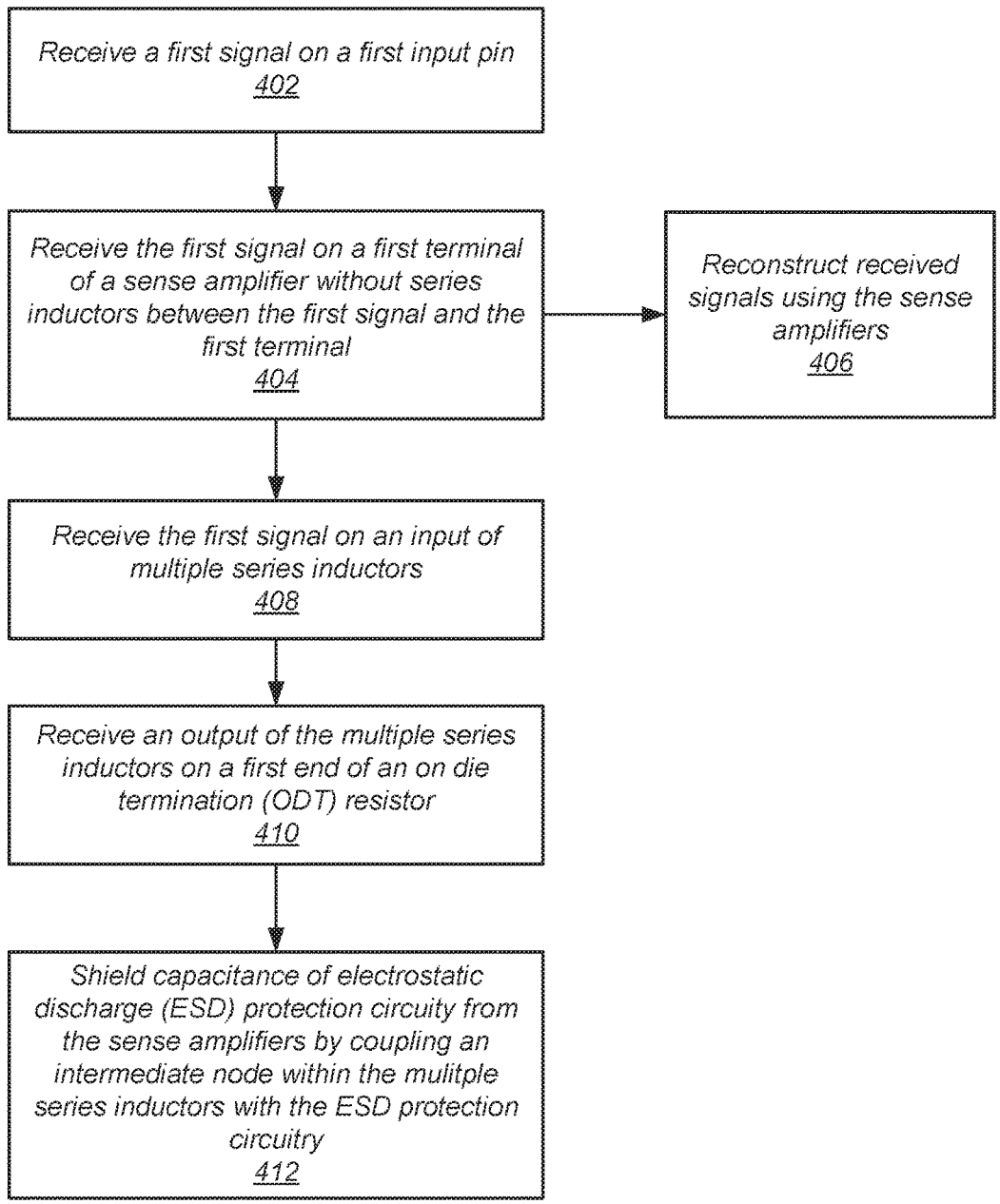
FIG. 4 is a flow diagram of one embodiment of a method for receiving information as signals in a computing system.

The above details and other details are further described in the following description. In the below description, FIG. 1 describes a communication bus using receivers that reduce input signal attenuation. FIG. 2 describes a receiver front-end with series inductors in the path from the input signal to the sampling circuitry. FIG. 3 describes a receiver front-end with the DC resistances of series inductors moved from a first path between the input pin and the sampling circuitry to a second path between the input pin and the termination circuitry used for impedance matching. The direct connection between the input pin of the receiver and the first terminal of the sampling circuitry reduces signal attenuation. FIG. 4 describes a method for reducing signal attenuation while maintaining impedance matching and boosting the impedance at higher operating signal frequencies.

Referring to FIG. 1, a generalized block diagram of one embodiment of a communication bus 100 is shown. As shown, communication bus 100 includes transmitters 110-124 for sending information as electrical signals, transmission lines 150-164 for transferring the electrical signals, and receivers 130-144 for receiving the signals. Additionally, communication bus 100 includes a voltage generator 170 for generating one or more of a termination voltage (VTT) 172 and a reference voltage.

In the illustrated embodiment, receiver 144 receives an input signal 180 from transmission line 164. Receiver 144 includes a front-end with the direct current (DC) resistances of series inductors 182-184 moved from a first path between the input signal 180 and sampling circuitry (not shown) to a second path. The second path is between the input signal 180 and the termination circuitry, such as on-die termination (ODT) resistor 186 used for impedance matching. The direct connection between the input signal 180 of receiver 144 and the sampling circuitry reduces signal attenuation of the signal received by the sampling circuitry. One or more of the receivers 130-142 includes a front-end similar to receiver 144.

It is noted that the term "bus" may also be referred to as a "channel," and each "transmission line" is a "lane" or a "trace" or a "wire." In various embodiments, transmission lines 150-164 are constructed from a variety of suitable metal sources during semiconductor fabrication and surrounded by a variety of any suitable insulating material. It is also noted that the terms "pin," "port," "terminal," and "node" are used interchangeably herein. Although eight transmitters 110-124, eight transmission lines 150-164 and eight receivers 130-144 are shown, in other embodiments, any number of these components is used.

As shown, in some embodiments, VTT 172 is sent to each of the receivers 130-144. In some embodiments, a reference voltage is also sent from voltage generator 170 to each of the receivers 130-144. In some embodiments, one or more of VTT 172 and the reference voltage is generated internally within receivers 130-144. In various embodiments, VTT 172 is used within termination circuitry for impedance matching within the receivers 130-144 and the reference voltage is used by sampling circuitry within the receivers 130-144.

In some embodiments, a bus with 40 transmission lines uses communication bus 100 instantiated five times. Accordingly, when VTT 172 is not the ground reference voltage, an average value of one or more of VTT 172 is at least partially derived from average transmitter currents being pushed and pulled (sourced and sunk) on transmission lines 150-164 by circuitry in transmitters 110-124. The directions of the transmitter currents on transmission lines 150-164 are based on whether the transmission lines 150-164 are being charged to logic high values or discharged to logic low values. In other words, the direct current (DC) patterns on the transmission lines 150-164 over time partially derive the average value of VTT 172 when VTT 172 is not the ground reference voltage.

In some embodiments, when the bus with 40 transmission lines uses communication bus 100 instantiated five times, each instantiation of communication bus 100 uses a respective voltage generator. The value of VTT 172 in each instantiation is set by the voltage generator in each instantiation. When VTT 172 is not the ground reference voltage, the average value of VTT 172 is partially set by the average transmitter currents being pushed and pulled by the eight transmitters 110-124 charging and discharging the eight transmission lines 150-164. In other embodiments, a single voltage generator, such as voltage generator 170, sends one or more of VTT 172 and a reference voltage to each of the 40 receivers. In such embodiments, the value of VTT 172 is set by the voltage generator 170. The average value of VTT 172 is partially set by the average transmitter currents being pushed and pulled by the 40 transmitters charging and discharging the 40 transmission lines.

In some embodiments, the signals sent from transmitters 110-124 to receivers 130-144 are single-ended data signals. The term "single-ended signal" is defined as an electrical signal which is transmitted using a single signal conductor. For example, in an embodiment, receiver 130 receives a single-ended signal from transmitter 110 via transmission line 150, which is a single signal conductor. In contrast to using single-ended data signals, sending information with differential data signals uses more lines and more pins. A reference signal is not generated and sent to multiple pins (or multiple receivers) when differential data signals are used. As is known in the art, differential signaling generally provides better noise immunity than single-ended signaling. However, the use of differential signaling comes at the added cost of extra pins and extra traces.

In order to better handle noise issues and signal loss in transmission lines 150-164 when using single-ended signaling, one or more of receivers 130-144 includes a front-end as shown for receiver 144. As shown, this receiver front-end includes the DC resistances of series inductors 182-184 moved from the first path between the input signal 180 and sampling circuitry (not shown) to the second path between the input signal 180 and the termination circuitry. In the illustrated embodiment, the termination circuitry includes on-die termination (ODT) resistor 186 used for impedance matching. As shown, ODT resistor 186 is also coupled to termination reference voltage 188. In some embodiments, termination reference voltage 188 is generated by voltage generator 170.

In some embodiments, the intermediate node between inductors 182 and 184 is coupled to electrostatic discharge (ESD) protection circuitry. In an embodiment, this ESD protection circuitry has an appreciable amount of capacitance. In one embodiment, this ESD protection circuitry includes diodes arranged in a configuration for human body model (HBM) protection. By coupling the intermediate node between inductors 182 and 184 to the ESD protection circuitry, input signal 180 is still protected by the ESD protection circuitry while being shielded from the capacitance of the ESD protection circuitry.

Although the multiple series inductors 182-184 provide additional DC resistance in the path from input signal 180 to the ODT resistor 186, impedance matching is still maintained. For example, the value of the ODT resistor 186 is tuned based on the additional resistance of the series inductors 182-184. In one example, if the impedance of the transmission line 164 is 50 ohms and the total resistance of the series inductors 182-184 is 3 ohms, then the ODT resistor 186 is set to 47 ohms. Further, series inductors 182-184 provide higher termination impedance at higher signal operating frequencies due to the alternating current (AC) reactance of series inductors 182-184 being $2\pi f \times (L1+L2)$ where f is the signal frequency and L1 and L2 are the inductances of inductors 182 and 184. The frequency-dependent termination inductance boosts the input signal 180 being received by the sampling circuitry.

Turning now to FIG. 2, a generalized block diagram of one embodiment of a receiver front-end 200 is shown. In the illustrated embodiment, receiver front-end 200 includes an input pin 210 for receiving an input signal 212, a termination voltage pin 240 for receiving a termination voltage, a reference voltage pin 242 for receiving a reference voltage, an on die termination (ODT) resistor 230 for impedance matching, electrostatic discharge (ESD) protection circuitry such as human body model (HBM) block 250 and charged device model (CDM) block 260, and sampling circuitry such as sense amplifiers 270-272. Receiver front-end 200 also includes storage elements 280-282 for storing the outputs of the sense amplifiers 270-272 before sending the outputs to other circuitry within the receiver.

In contrast to receiver 144 (of FIG. 1) described earlier, receiver front-end 200 includes the direct current (DC) resistances of series inductors 220-222 in the path between the input signal 212 and the sampling circuitry, which includes sense amplifiers 270-272. The tradeoffs between the receiver front-end approaches of receiver 144 and receiver front-end 200 is provided followed by a further description of the remaining components in receiver front-end 200. Later, a further description of a receiver front-end with series inductors in the termination path, which was shown earlier in receiver 144, is provided in the description of receiver front-end 300 (of FIG. 3). Continuing now with the tradeoffs between the two approaches, the DC resistances of series inductors 220-222 performs a conversion of the electrical current to heat, or thermal energy, which causes loss of electrical information in input signal 212 before it reaches sense amplifiers 270-272. Therefore, signal attenuation of input signal 212 occurs before the sense amplifiers 270-272 receive input signal 212.

A cost, which is the signal loss (signal attenuation), occurs by having input signal 212 traverse series lossy inductors 220-222 before reaching sense amplifiers 270-272. This signal loss due to signal attenuation by series lossy inductors 220-222 is also referred to as "insertion loss." With the amplitudes of input signal 212 and the reference voltage received from pin 242 being a fraction of a volt, signal attenuation becomes a critical factor at the input of sense amplifiers 270-272. In one example, the peak amplitude of alternating input signal 212 is 25 millivolts (mV), and the DC value of reference voltage received from pin 242 is one half of the magnitude of the supply voltage VDD. Therefore, signal attenuation of input signal 212 through the DC resistances of series inductors 220-222 becomes critical. Either the sensitivity of the sense amplifiers 270-272 is designed to be higher, or corruption of data received on input pin 210 occurs.

Another source of signal loss is return loss. Signal reflection on the external transmission line coupled to input pin 210 is also referred to as "return loss." If the electrical current on the external transmission line is not converted to heat, then the electrical information in input signal 212 remains in the external transmission line to reflect back and forth. This reflection interferes with other values being transmitted from an external transmitter through the external transmission line to the input pin 210 of receiver front-end 200. Therefore, a termination impedance is used in receiver front-end 200 such as on-die termination (ODT) resistor 230. As shown, the ODT resistor 230 is coupled between input pin 210 and the termination voltage pin 240. The ODT resistor 230 removes the potential for reflection in the external transmission line.

With advances in semiconductor fabrication techniques, device sizes reduce and geometric distances also decrease. Additionally, operating voltages have reduced while operating frequencies have increased. The increased operating frequencies cause the need for termination impedances to increase, if impedance matching is to be achieved. However, signals on transmission lines, such as signal 212, operate with a range of frequencies in broadband applications.

Typically, the ODT resistor 230 provides impedance matching for low-frequency and mid-frequency applications. The impedance matching provides a zero or near-zero reflection coefficient where the reflection coefficient is the ratio of reflected wave to incident wave at the point of reflection. Here, the point of reflection is the end of the external transmission line where the receiver front-end 200 is located. However, for high-frequency applications, the ODT resistor 230 does not meet the higher impedance matching demands. Therefore, for high-frequency applications, the ODT resistor 230 provides a negative reflection coefficient, and subsequent signals received on input pin 210 are degraded with return loss. Reflection at any impedance change point on the external transmission line including the end of the transmission line at receiver front-end 200 results in signal distortion, signal ringing and so forth.

Another characteristic of the reduced geometric dimensions is less on-die area to build the inductors 220 and 222. As a consequence, the quality of inductors 220 and 222 reduce. The electrons flowing in the coiled wire of inductors 220 and 222 create a magnetic field, which is proportional to the electric current which serves as its source as stated by Ampere's Law. An alternating current, such as that used in the AC signal 212, creates a constantly changing magnetic field. This changing magnetic field in a coil generates, or induces, a voltage in the coil as stated by Faraday's Law. However, these dynamics degrade as the area provided to build these coils reduce. In its place, is an element resembling a straight piece of wire, or essentially a resistor. Therefore, as the geometric dimensions decrease, the quality of the inductors 220 and 222 decrease, and the DC resistances of the inductors 220 and 222 increase. The increased resistances of series inductors 220 and 222 attenuate signal 212 before it reaches the positive terminals of sense amplifiers 270-272.

For applications with relatively large amplitude signals, such as greater than one volt, and relatively low- or mid-operating frequencies, such as less than one gigahertz, receiver front-end 200 is typically able to receive signals with near-zero reflection and negligible signal attenuation before being received by sense amplifiers 270-272. However, for relatively small amplitude signals, such as less than one volt, and relatively high operating frequencies, such as greater than one gigahertz, a front-end used by receiver 144 (of FIG. 1) is typically able to receive signals with near-zero reflection and negligible signal attenuation before being received by sense amplifiers 270-272. A receiver front-end using the configuration shown in the earlier receiver 144 is provided in receiver front-end 300 (of FIG. 3). Before describing such a configuration, a description of the remaining components of receiver front-end 200 is provided.

As shown, the ESD protection circuitry, such as human body model (HBM) block 250 and charged device model (CDM) block 260, use diode clamping circuits. For example, the HBM block 250 uses diodes 254 and 256 in a series configuration, and similarly, CDM block 260 uses diodes 264 and 266 in a series configuration. When an input voltage received by either HBM block 250 or CDM block 260 exceeds the supply voltage VIN 252 by a diode drop or the input voltage falls below the ground reference voltage by a diode drop, then one of the diodes in the series configuration is turned on and conducts. Therefore, the output voltage, such as the voltage at a node between the serially connected diodes, from either HBM block 250 or CDM block 260 is clamped.

The clamped output voltage of either HBM block 250 or CDM block 260 does not exceed the supply voltage VIN 252 by a threshold and does not fall below the ground reference voltage by more than a threshold. Here, the threshold is the diode drop of diodes 254, 256, 264 and 266. The series resistor 262 provides an IR drop before the input signal 212 reaches the node between diodes 264 and 266. In other embodiments, other diode networks, such as diode bridges, or a quick-switch (Q-Switch), such as a transistor controlled by an overvoltage detector, or other examples of protection circuitry are used. In some embodiments, inductor L1 220 and inductor L2 222 are used to reduce the net effective capacitance at signal 212 by reducing the additional capacitance provided by diodes 254 and 256 within HBM 250. The reduction of the capacitance on input signal 212 aids the functionality of sense amplifiers 270-272.

As described earlier, ODT resistor 230 is used for impedance matching. In some embodiments, ODT resistor 230 is a variable resistance capable of being set at two or more predetermined values. For example, in an embodiment, ODT resistor 230 is capable of being set from 50 ohms to 200 ohms with a 50 ohm step. In the illustrated embodiment, the ODT resistor 230 receives a termination voltage from termination voltage pin 240. The sampling circuitry, such as sense amplifiers 270-272, receives a reference voltage from reference voltage pin 242. In some embodiments, the termination voltage is a ground reference and the reference voltage is a fraction of the supply voltage VIN 252. In other embodiments, the termination voltage is also a fraction of the supply voltage VIN 252.

In the illustrated embodiment, the output voltage of CDM block 260 is received by sampling circuitry such as sense amplifiers 270-272. Although two sense amplifiers are shown, in other embodiments, any suitable number of sense amplifiers is used. In an embodiment, sense amplifiers 270-272 receive the output voltage of CDM block 260 on a positive terminal and receive the reference voltage from pin 242 on a negative terminal. In various embodiments, each one of sense amplifiers 270-272 generates a respective output signal, or a second signal, based on a comparison of a voltage of the input signal 212, which is the first signal, to the reference voltage received on pin 242. More accurately, the sense amplifiers 270-272 perform a comparison of the actual voltage values received on the positive terminal and the negative terminal, which in some cases, deviate from the input signal 212 and the reference voltage received on pin 242 due to parasitic capacitances, noise, and so on. This output signal of a given one of sense amplifiers 270-272 is received by one of the sequential elements 280-282 and used to reconstruct the information received on input pin 210.

In various embodiments, sense amplifiers 270-272 are clocked sense amplifiers although a clock input signal is not shown. A dashed box is shown around sense amplifier 270 and sequential element 280 to indicate in various embodiments that one or more clock input signals are received and the circuitry for sense amplifier 270 and sequential element 280 is combined, rather than the circuitry is in separate elements. Similarly, a dashed box is shown around sense amplifier 272 and sequential element 282 to indicate in various embodiments that one or more clock input signals are received and the circuitry for sense amplifier 272 and sequential element 282 is combined, rather than the circuitry is in separate elements.

In some embodiments, the combination of sense amplifiers 270-272 and storage elements 280-282 sample and store the signal output from CDM 260. Again, in some embodiments, sense amplifiers 270-272 are clocked comparators where the input clock signal is not shown for ease of illustration. In an embodiment, storage elements 280-282 are flip-flop circuits, latches, registers or any other suitable sequential storage element. In an embodiment, one or more of sense amplifiers 270-272 and storage elements 280-282 sample on active edges of a received clock signal, which is not shown for ease of illustration. In some embodiments, the rising edge of a clock signal is used as the active edge, whereas, in other embodiments, the falling edge of the clock signal is used as the active edge. In some embodiments, one or more of sense amplifiers 270-272 and storage elements 280-282 sample on opposite edges of the clock signal than other ones of sense amplifiers 270-272 and storage elements 280-282.

In an embodiment, a first period of time between a rising edge and a falling edge on the output of CDM 260 is used to determine a number of logic high values (binary '1') in an input bit stream. A period of time between a falling edge and a rising edge on the output of CDM 260 is used to determine a number of logic low values (binary '0') in an input bit stream. In an embodiment, one or more of sense amplifiers 270-272 and storage elements 280-282 send a stream of binary values to a deserializer 290, which is included in the receiver outside of the front-end 200. In an embodiment, the deserializer generates a sequence of parallel data words from the received stream of binary values and sends the data words to other logic blocks and/or arithmetic logic units. In some embodiments, the deserializer decreases the data transfer rate, which allows the other logic blocks to operate at a lower clock frequency than the combination of sense amplifiers 270-272 and storage elements 280-282.

Turning now to FIG. 3, a generalized block diagram of one embodiment of a receiver front-end 300 is shown. Logic and circuitry previously described is numbered identically in FIG. 3. In the illustrated embodiment, receiver front-end 300 uses a similar configuration as shown earlier for receiver 144 (of FIG. 1). Here, series inductors 320 and 322 are coupled between the input signal 212 and the termination circuitry, such as on-die termination (ODT) resistor 330, used for impedance matching. The DC resistances of series inductors 320-322 performs a conversion of the electrical current to heat, or thermal energy, in the path to the termination circuitry. The DC resistances of the series inductors 320-322 are not in the signal path to the sense amplifiers 270-272. The direct connection between the input signal 212 and the sense amplifiers 270-272 reduces signal attenuation of the signal received by the sampling circuitry.

The removal of series inductors in the signal path between the input signal 212 and the sense amplifiers 270-272 exposes the input pin 210 to the capacitance of the CDM block 260. However, this capacitance is typically negligible, so any resulting signal attenuation is also negligible. The placement of the series inductors 320-322 in the termination path provides a frequency-dependent termination impedance. As shown, the ODT resistor 330 is not directly coupled to the input pin 210. Rather, the ODT resistor 330 is coupled between the series inductors 320-322 and the termination voltage pin 240. Therefore, the termination impedance is the sum of the DC resistances of the series inductors 320-322, the DC resistance of the ODT resistor 330 and the alternating current (AC) reactance of series inductors 320-322, which is $2\pi f \times (L1+L2)$. Here, the variable "f" is the signal frequency and the variables "L1" and "L2" are the inductances of inductors 320 and 322. The frequency-dependent termination inductance provides a positive reflection coefficient for high operating frequencies, which boosts the input signal 212 being received by the sampling circuitry.

Although the series inductors 320-322 provide additional DC resistance in the termination path from input signal 212 to the ODT resistor 330, impedance matching is still maintained. For example, the value of the ODT resistor 330 is tuned based on the additional resistance of the series inductors 320-322. In one example, if the impedance of the external transmission line connected to the input pin 210 is 50 ohms and the total resistance of the series inductors 320-322 is 3 ohms, then the ODT resistor 330 is set to 47 ohms.

As described earlier, with advances in semiconductor fabrication techniques, device sizes reduce and geometric distances also decrease. As a consequence, the quality of the inductors 320 and 322 decrease, and the DC resistances of the inductors 320 and 322 increase. However, these effects do not attenuate the input signal 212 on the signal path between the input pin 210 and the sense amplifiers 270-272. Additionally, the DC resistances of the series inductors 320 and 322 are handled in the termination path by tuning the ODT resistor 330 as described earlier.

As shown, the intermediate node between the series inductors 320 and 322 is coupled to the HBM block 250. Therefore, input signal 212 is still protected by the HBM block 250 from electrostatic discharge while also being shielded from the capacitance of the HBM block 250. For applications using relatively small amplitude signals and relatively high operating frequencies, receiver front-end 300 is able to receive signals with near-zero reflection and negligible signal attenuation before being received by sense amplifiers 270-272 while also maintaining impedance matching.

Referring now to FIG. 4, one embodiment of a method 400 for receiving information as signals in a computing system is shown. For purposes of discussion, the steps in this embodiment are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 400.

A first signal is received on a first input pin (block 402). In some embodiments, the first signal is a single-ended data signal. In an embodiment, the first signal is sent by a transmitter across a transmission line to a receiver. The first signal is received on a first terminal of a sense amplifier without series inductors between the first signal and the first terminal (block 404). In various embodiments, a receiver front-end has series inductors moved from a first path between the input pin and sampling circuitry to a second path between the input pin and termination circuitry used for impedance matching. The direct connection between the input pin of the receiver and the first terminal of the sampling circuitry reduces signal attenuation.

The received signals are reconstructed in the receiver using the sense amplifiers (block 406). In various embodiments, additional circuitry such as sequential elements and deserializers are also used to reconstruct the received signals. As the received signals are reconstructed, the first signal is received on an input of multiple series inductors (block 408). An output of the multiple series inductors is received on a first end of an on-die termination (ODT) resistor (block 410). As described earlier, these multiple series inductors are in the termination path, rather than the signal path. The DC resistances of the multiple series inductors do not affect the input signal being received by the sampling circuitry. The DC resistances of the multiple series inductors provide series resistance for impedance matching. In one example, the DC resistances of the multiple series inductors are summed with an ODT resistor to match the impedance of the transmission line.

The multiple series inductors also provide a frequency-dependent termination impedance. The termination impedance is the sum of the DC resistances of the multiple series inductors, the DC resistance of the ODT resistor and the alternating current (AC) reactance of the multiple series inductors, which is $2\pi f \times (L1+L2)$. The frequency-dependent termination impedance provides a positive reflection coefficient for high operating frequencies, which boosts the input signal being received by the sampling circuitry.

The capacitance of electrostatic discharge (ESD) protection circuitry, such as human body model (HBM) protection circuitry, is shielded from the sense amplifiers by coupling an intermediate node within the multiple series inductors with the ESD protection circuitry (block 412). Therefore, the received input signal is still protected by from electrostatic discharge while also being shielded from the capacitance of the ESD protection circuitry. For applications using relatively small amplitude signals and relatively high operating frequencies, a receiver using the described topology is able to receive signals with near-zero reflection and negligible signal attenuation before being received by sense amplifiers while also maintaining impedance matching.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors that execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   a first input configured to receive a first signal; and
   a sense amplifier configured to:
      receive the first signal on a first terminal without series inductors between the first signal and the first terminal;
      receive a reference voltage on a second terminal; and
      generate a second signal based on a comparison of a voltage of the first signal to the reference voltage;
   a plurality of series inductors coupled to receive the first signal on a first end.

2. The circuit as recited in claim 1, further comprising electrostatic discharge (ESD) protection circuitry, wherein the plurality of series inductors is configured to shield capacitance of the ESD protection circuitry from the first terminal of the sense amplifier by coupling an intermediate node within the plurality of series inductors to the ESD protection circuitry.

3. The circuit as recited in claim 1, further comprising a resistor coupled to:
   receive an output signal from the plurality of series inductors on a second end; and
   receive a termination voltage on a third end.

4. The circuit as recited in claim 3, wherein the resistor is set to a value equal to an impedance of the transmission line minus a sum of impedances of each one of the plurality of series inductors.

5. The circuit as recited in claim 1, wherein the first signal is a single-ended data signal.

6. The circuit as recited in claim 1, further comprising a deserializer configured to:
   receive the second signal; and
   generate a sequence of parallel data words based at least in part on the second signal.

7. The circuit as recited in claim 1, further comprising a second input configured to receive the reference voltage.

8. The circuit as recited in claim 5, wherein the reference voltage is routed to inputs of a plurality of external circuits.

9. A method, comprising:
   receiving a first signal on a first input of a receiver;
   receiving the first signal on a first terminal of a sense amplifier without series inductors between the first signal and the first terminal;
   receiving a reference voltage on a second terminal of the sense amplifier;
   generating a second signal based on a comparison of a voltage of the first signal to the reference voltage; and
   receiving the first signal on a first end a plurality of series inductors.

10. The method as recited in claim 9, further comprising shielding capacitance of electrostatic discharge (ESD) protection circuitry from the first terminal of the sense amplifier by coupling an intermediate node within the plurality of series inductors to the ESD protection circuitry.

11. The method as recited in claim 9, further comprising:
   receiving an output signal from the plurality of series inductors on a second end of a resistor; and
   receiving a termination voltage on a third end of the resistor.

12. The method as recited in claim 11, further comprising setting to a value of the resistor to an impedance of the transmission line minus a sum of impedances of each one of the plurality of series inductors.

13. The method as recited in claim 9, wherein the first signal is a single-ended data signal.

14. An apparatus comprising:
   a plurality of receivers configured to receive signals;
   a plurality of transmitters configured to send a plurality of signals to the plurality of receivers;
   wherein a given receiver of the plurality of receivers is configured to receive a first signal of the plurality of signals from a given transmitter of the plurality of transmitters;
   wherein the given receiver comprises a sense amplifier configured to:
      receive the first signal on a first terminal without series inductors between the first signal and the first terminal;
      receive a reference voltage on a second terminal; and
      generate a second signal based on a comparison of a voltage of the first signal to the reference voltage;
   wherein the given receiver further comprises a plurality of series inductors coupled to receive the first signal on a first end.

15. The apparatus as recited in claim 14, wherein the given receiver further comprises electrostatic discharge (ESD) protection circuitry, and wherein the plurality of series inductors is configured to shield capacitance of the ESD protection circuitry from the first terminal of the sense amplifier by coupling an intermediate node within the plurality of series inductors to the ESD protection circuitry.

16. The apparatus as recited in claim 14, wherein the given receiver further comprises a resistor coupled to:
   receive an output signal from the plurality of series inductors on a second end; and
   receive a termination voltage on a third end.

17. The apparatus as recited in claim 16, wherein the resistor is set to a value equal to an impedance of the transmission line minus a sum of impedances of each one of the plurality of series inductors.

* * * * *